METHOD OF FABRICATING SUB-MINIATURE SEMI-CONDUCTOR MATRIX APPARATUS

Filed June 5, 1961

INVENTOR.
RALPH SAUNDERS

BY Carl Fissel Jr.
AGENT

United States Patent Office 3,158,927
Patented Dec. 1, 1964

3,158,927

METHOD OF FABRICATING SUB-MINIATURE SEMICONDUCTOR MATRIX APPARATUS

Ralph Saunders, Havertown, Pa., assignor to Burroughs Corporation, Detroit, Mich., a corporation of Michigan
Filed June 5, 1961, Ser. No. 124,253
12 Claims. (Cl. 29—155.5)

The present invention primarily relates to a method of fabricating semi-conductor matrix apparatus wherein semi-conductor elements such as diodes are bonded to conductive busses of printed wiring assemblies. Another aspect of the invention has to do with the method of transferring electrical components such as silicon diodes from a supporting structure to a printed wiring matrix assembly.

It is the principal object of the invention to provide an improved method for fabricating sub-miniature semi-conductor matrix apparatus.

It is a further object of the invention to provide a method for joining printed wiring busses to electrical semi-conductor circuit components sandwiched between high dielectric material.

It is an additional object of the invention to provide an improved method for assembling and electrically interconnecting an array of minute etched or ultrasonically machined electrical components, such as diodes, to printed wiring on dielectric structures.

It is still another object of the invention to provide a method of bonding silicon diodes to obverse and reverse printed wiring panels thus to form a silicon diode matrix.

In accordance with the foregoing objects and first briefly described, the invention comprises the method of bonding a plurality of semi-conductor elements to an array of printed wiring busses thus to form an electrical storage or switching matrix.

Additional objects and advantages of the invention will appear in the following detailed specification when read in conjunction with the drawings forming a part hereof and in which.

Briefly described, the method comprises the steps of providing a pair of separate printed circuit assemblies and a substrate support upon which semi-conductor elements, such as diodes, are releasably adhesively secured in a desired matrix array, bonding—as by soldering—the printed circuits of one of the printed circuit assemblies to one side of the diodes with the printed circuits in one direction, removing the substrate by dissolving the adhesive, and finally bonding—again as by soldering—the printed circuits on the other printed circuit assembly to the other side of the diodes with the printed circuits arranged at right angles to those on the other printed circuit assembly.

Figure 1:
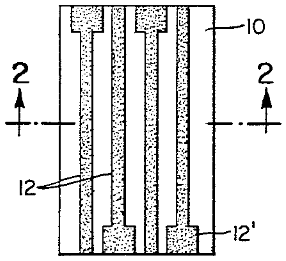
FIG. 1 is a plan view of a printed wiring assembly.

Now specifically, and with reference to the drawings, it is seen in FIG. 1 that a preferred printed circuit assembly comprises a suitable dielectric circuit panel or plate 10, such for example as "Corning Pyrex #7740," "screened," or otherwise provided, with a predetermined conductive pattern of busses 12 terminating in pads 12′. When "screened" an electrically conductive material such as "Du Pont Conductive Frit, #7753, Gold, Platinum Paste" is used. The "screened" plate 10 is then fired at a temperature of approximately 650°–800° C. for a time sufficient to produce a strong bond between the glass and the electrically conductive layer on the order of approximately ten minutes.

Figure 2:
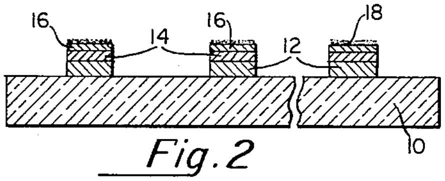
FIG. 2 is a sectional view along the line 2—2 of FIG. 1.

The fired plate 10 is then provided with a relatively thin coating of copper 14 (FIG. 2) preferably electroplated thereon, and to which is added by suitable means a plating 16, for example, of 60/40 solder varying as desired from approximately .1 to .001″ thick.

It is understood, of course, that other substrate material might be used to advantage, such as, for example, by substituting for the Pyrex glass plate 10 a glass or glass epoxy material which may be laminated or clad with copper material on both surfaces. A conductive circuit pattern may then be provided by any well known printed circuit process thus to produce solder-plated circuits similar in construction to the Pyrex plate 10. Still further, the circuit plate substrate could, of course, be made of other material such as ordinary glass, copper clad phenolic or other similar dielectric material.

The busses 12 and pads 12′ of the prepared circuit plate 10 are then coated in a known manner with a layer of soldering flux 18 such for example as "Kester's #135" after which the fluxed surface is dried in ambient air or, if desired, it may be more quickly dried in forced hot air to permit the flux to become slightly tacky and adhesive in consistency.

Figure 3:
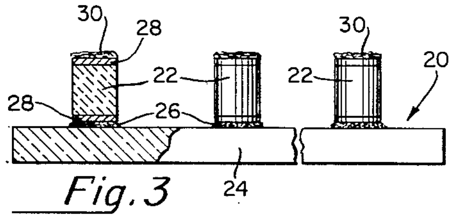
FIG. 3 is a side elevational view, partially in section, of a diode array or matrix.

An assembly 20 which may be fabricated as by etching etc. or by ultrasonic machining techniques set forth in a copending application to Frederick Ohntrup, Serial No. 114,956, entitled "Fabricating Tool and Technique," filed concurrently herewith on June 5, 1961 and assigned to the same assignee as the present invention, to include an array of diodes 22 (FIG. 3) having a conductive solderable coating 28 on opposite sides thereof and releasably bonded to a supporting substrate or transfer plate 24 by a soluble adhesive 26. The coating 28 is or may be a sintered electroless nickel, and bonds thoroughly and completely to the silicon surface of the wafer. The transfer plate 24 preferably is of Pyrex and the cement or adhesive 26 of a type capable of withstanding ultrasonic machining and temperatures in excess of approximately 500° F. for brief periods without charring. A suitable cement, for example, is "Lakeside 70C," manufactured by Hugh Cartwright & Co., Chicago, Ill.

The exposed top surfaces of the coated diodes 22 are sprayed or brushed with a suitable flux 30, for example, "Dunton's Tinner's Flux" (acid) manufactured by H. W. Dunton, Providence, R.I., and thereafter the assembly is blotted to remove the excess flux.

Figure 4:
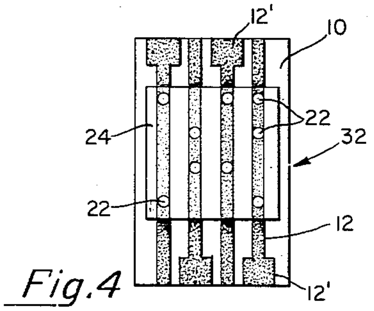
FIG. 4 is a top plan view of the diode array of FIG. 3 adhesively secured to the printed wiring assembly of FIG. 1.

The assembly 20 carrying the prepared diodes 22 is then joined to the printed circuit assembly 10 by bringing the diode array into surface contact with the adhesively tacky surface of the printed wiring on circuit plate 10, as seen in FIG. 4. The diode array is properly and accurately registered with the conductor busses 12 on the plate 10. Thereafter, slight pressure is applied to cause the two assemblies 10 and 20 to stick together in exact registration thus to form the assembly 32, after which the adhesive is allowed to dry.

The dried assembly 32 is then placed under pressure in a suitable soldering fixture such as shown at 34 of generally U-shaped configuration. Fixture 34 includes parallel spaced apart legs 36 and 38 and a centrally disposed "back-up" member 40 carrying a pressure pad 42 and pivoted at its end 44 to the base 46 thereof. A spring 48 biases the member 40 toward the leg 38 which is formed of a suitable heat transfer material, such as metal.

With the assembly 32 so disposed, the spring 48 causes the member 42 to press the diodes against the printed wiring member 10 conditioning the latter for soldering. By means of a heating element 50 in contact with heat transfer leg 38, adjustable for a desired temperature level by means, not shown, and energized over leads 52 from a source of current 54, heat is transferred through leg 38 causing the solder to melt sufficiently to bond the diodes to their respective printed wiring busses.

The soldered assembly 32 is removed from the fixture 34 and placed in a shallow tray 54 containing a suitable solvent 56 such as trichlorethylene, which may be heated, so as to dissolve the bonding adhesive 26 thus to separate the substrate 24 from the diodes 22 and also more adequately to clean the remaining flux from the circuit plate and the diodes. The assembly is thereafter placed in a detergent solution 58 preferably at boiling temperature to remove any remaining traces of dirt or other foreign material. The assembly is then rinsed clean, in water and/or alcohol for example, after which it is dried.

Figure 5:
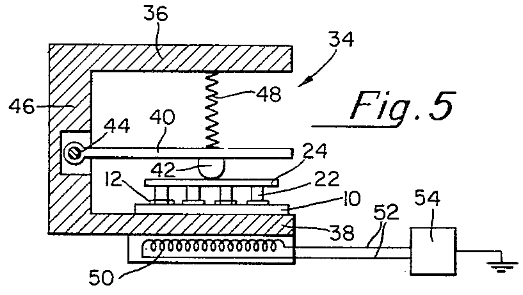
FIG. 5 is a sectional view of a soldering jig used in the present invention.
Figure 6:
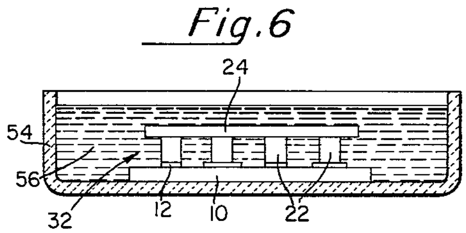
FIGS. 6 and 7 are sectional views showing chemical baths employed in the present invention.
Figure 7:
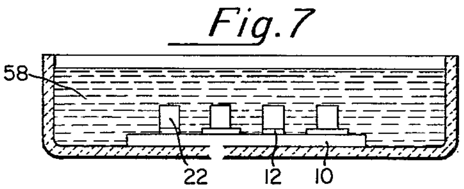
Figure 8:
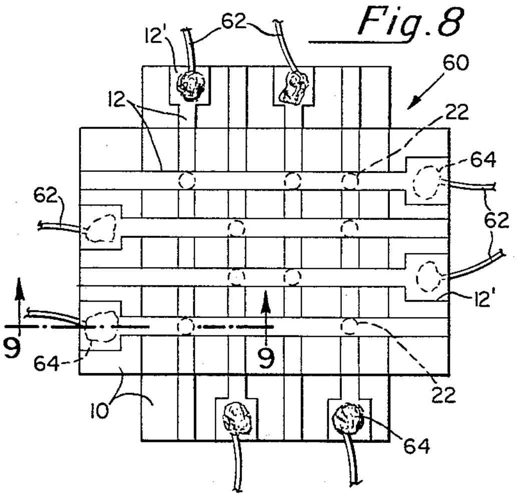
FIG. 8 is a plan view of a diode matrix according to the present invention; and, FIG. 9 is a sectional view along line 9—9 of FIG. 8 of a portion of the diode matrix of FIG. 8.

In the manner set forth hereinbefore a second circuit plate 10 is prepared and the now dried assembly 32 is reversed from the position it first occupied in the jig of FIG. 5 and reinserted therein with its conductive busses 12 oriented at right angles or other appropriate alignment or arrangement to those of the first plate and in register with the opposite sides of the diodes and against the heat transfer leg 38. The element 50 is again energized so as to solder the busses of the second circuit plate to the opposite ends of the diodes thus to form the assembly 60 as shown in FIG. 8. This multi-layer assembly 60 is then given a final etching treatment in an etchant which is compatible with the solder thus to remove roughness, if any, such as might be due to the ultrasonic machining operation of the diodes. Thereafter it is washed and rinsed and dried.

Figure 9:
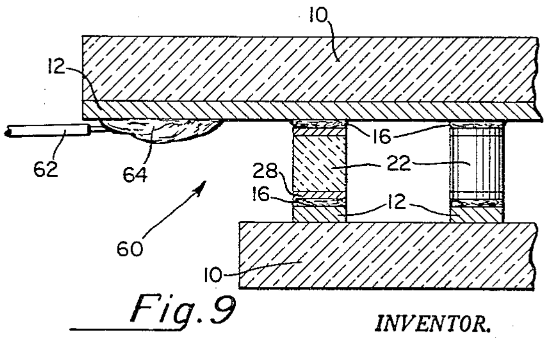

Finally, if desired, suitable lead wires 62, FIG. 9, may be attached as by solder 64 to the pads 12' of each of the busses on the circuit plates whereby interconnection thereof may be made to other associated circuitry or utilization device such for example, as beam switching or indicating tubes. Or, the assembly may be employed as a plug-in unit by virtue of appropriate design of the pads.

What is claimed is:

1. A method of forming a miniature semi-conductor matrix comprising the steps of, providing a dielectric supporting structure with a pattern of conductive busses printed thereon, providing a dielectric supporting structure with a plurality of semi-conductors bonded thereon by means of a soluble adhesive permitting subsequent removal of said supporting structure therefrom, applying a viscous flux to said busses, applying a flux to said semi-conductors, registering said semi-conductors and said busses, soldering said semi-conductors to said busses while so registered and thereafter, removing the dielectric supporting structure from said semi-conductors leaving the latter firmly bonded to said busses.

2. A method of forming a miniature semi-conductor comprising the steps of, providing a glass epoxy supporting structure with a pattern of columns and rows of conductive busses printed thereon, providing a dielectric glass epoxy supporting structure with a plurality of vertically disposed rows and columns of semi-conductors bonded thereon by means of a soluble adhesive permitting subsequent removal of said supporting structure therefrom, applying a viscous flux to said busses, applying a flux to said semi-conductors, registering the rows and columns of semi-conductors with the rows and columns of busses, soldering said semi-conductors to said busses while so registered and, thereafter, removing the dielectric supporting structure from said semi-conductors leaving the latter firmly fixed to said busses.

3. A method of forming a miniature semi-conductor matrix comprising the steps of, providing a dielectric substrate, bonding a wafer of silicon material on said substrate by means of a soluble adhesive permitting subsequent removal of said substrate therefrom, forming said silicon material into a plurality of rows and columns of individual silicon diodes, providing a dielectric supporting structure with a pattern of conductive busses printed thereon in parallel spaced apart relationship and including enlarged conductive areas at one end of each conductive buss, applying a viscous flux to said busses, drying said flux to a tacky adhesive consistency, applying a flux to the surface of said diodes, registering said diodes with respective busses in said rows and columns, soldering the diodes to the busses when so registered and, removing the dielectric supporting structure from the diodes leaving the latter firmly bonded to said busses, cleaning said assembly to remove any traces of flux therefrom.

4. A method of forming a miniature semi-conductor matrix comprising the steps of, providing a dielectric substrate, bonding a wafer of silicon material onto said substrate by means of a soluble adhesive permitting subsequent removal of said substrate therefrom, forming said silicon material on said substrate into a plurality of rows and columns of individual silicon diodes, providing a dielectric supporting structure with a pattern of conductive busses printed thereon in parallel spaced apart relationship and including enlarged conductive areas at one end of each conductive buss, applying viscous flux to said busses, drying said flux to a tacky adhesive consistency, applying a flux to the exposed surface of said diodes, registering said diodes with respective busses in said rows and columns, soldering the diodes to the busses when so registered, removing the dielectric substrate from the diodes leaving the latter firmly bonded to the busses with their opposite ends exposed, providing a second dielectric supporting structure with a pattern of conductive busses printed thereon in parallel spaced apart relationship, and including enlarged conductive areas at one end of each bus, registering the conductive pattern of busses of the second dielectric supporting structure at right angles to the original conductive busses with the individual diodes, bonding the exposed ends of the diodes to said second set of conductive busses forming an orthogonal matrix and finally, cleaning said assembly to remove any traces of flux therefrom.

5. A method of forming a miniature semi-conductor matrix comprising the steps of, providing a dielectric substrate, bonding a wafer of silicon material on said substrate by means of a soluble adhesive permitting subsequent removal of said substrate therefrom, forming said silicon material into a plurality of rows and columns of individual diodes, providing a dielectric supporting structure with a pattern of conductive busses printed thereon in parallel spaced apart relationship and including enlarged conductive areas at one end of each conductive buss, applying a viscous flux to said busses, drying said flux to a tacky adhesive consistency, applying a flux to the surface of said diodes, registering said diodes with respective busses in said rows and columns, soldering the diodes to the busses when so registered, and, removing the dielectric supporting structure from the diodes leaving the latter firmly bonded to said busses, cleaning said assembly to remove any traces of flux therefrom, applying electrical lead wire conductors to said busses.

6. The method of transferring electrical components from a supporting structure to a printed wiring assembly comprising, securing an electrical component upon a supporting substrate element by means of a soluble adhesive, providing an exposed surface of said component with a solderable coating, securing an electrical conductor on a dielectric substrate, coating said conductor with a film of solder, providing a tacky adhesive flux on the exposed surface of the component and the conductor, joining said substrates by bringing said component into contact with said conductor whereby the tacky adhesive flux secures them together, subjecting said joined substrates to heat and pressure sufficient to cause said solder to bond said component to said conductor, and finally dissolving said adhesive and removing the substrate element upon which said component was supported leaving the component securely bonded to the conductor.

7. A method of transferring diodes from a supporting structure to a printed wiring assembly comprising, securing a diode upon a supporting substrate element by means of a soluble adhesive, providing an exposed surface of said diode with a solderable coating and a tacky adhesive flux, securing an electrical conductor on a dielectric substrate, coating said conductor with a film of solder and a tacky adhesive flux, joining said substrates by bringing said diode into contact with said conductor whereby the tacky adhesive flux secures them together, subjecting said joined substrates to heat and pressure sufficient to cause said solder to bond said diode to said conductor, and finally dissolving said adhesive and removing the substrate element upon which said diode was supported leaving the diode securely bonded to the conductor.

8. The method of transferring electrical components from a supporting structure to a printed wiring assembly comprising, securing a plurality of electrical components in rows upon a substrate element by means of a soluble adhesive, providing an exposed surface of each of said components with a solderable coating, securing a plurality of electrical conductors in parallel on a dielectric substrate, coating said conductors with a film of solder, providing a tacky adhesive flux on the exposed surfaces of said components and the conductors, joining said substrates by bringing respective of said rows of components into contact with a conductor whereby the tacky adhesive flux secures them together, subjecting said joined substrates to heat and pressure sufficient to cause said solder to bond said components to said conductors, and finally dissolving said adhesive and removing the substrate element upon which said components were supported, leaving the components securely bonded to said conductors.

9. The method of transferring diodes from a supporting structure to a printed wiring assembly comprising, securing a plurality of diodes in rows upon a supporting substrate element by means of a soluble adhesive, providing an exposed surface of each of said diodes with a solderable coating and a tacky adhesive flux, securing a plurality of electrical conductors in parallel on a dielectric substrate, coating said conductors with a film of solder and a tacky adhesive flux, joining said substrates by bringing respective of said rows of diodes into contact with a conductor whereby the tacky adhesive flux secures them together, subjecting said joined substrates to heat and pressure sufficient to cause said solder to bond said diodes to said conductors, and finally dissolving said adhesive and removing the substrate element upon which said diodes were supported, leaving the diodes securely bonded to said conductors.

10. The method of fabricating subminiature component matrix apparatus comprising the steps of, securing an array of components in rows and columns on a substrate element by means of a soluble adhesive, opposite surfaces of said components being provided with a solderable coating, providing first and second printed wiring assemblies each including a plurality of substantially parallel electrical conductors printed on a dielectric substrate element, applying a tacky adhesive flux to the exposed surfaces of said conductors and said components, joining the first of said printed circuit assemblies with said component substrate element by bringing said components into contact with the conductors on said first printed circuit assembly whereby the tacky adhesive flux secures them together with said conductors crossing the rows of components, subjecting said joined substrates to heat and pressure sufficient to cause said solder to bond said components to said printed conductors, dissolving said adhesive and removing the substrate element upon which the components were supported, applying a tacky adhesive flux to the now exposed surfaces of said components, joining said second printed circuit assembly with the now exposed surfaces of said semi-conductor components by bringing them into contact whereby the tacky adhesive flux secures them together with the conductors on said second printed circuit assembly traversing the columns of said components at right angles to the conductors on the first printed circuit assembly, and subjecting the now joined substrates again to heat and pressure sufficient to cause said solder to bond said components with the conductors on said second printed circuit assembly.

11. The method of fabricating subminiature diode matrix apparatus comprising the steps of, securing an array of diodes in rows and columns on a substrate element by means of a soluble adhesive, opposite surfaces of said diodes being provided with a solderable coating, providing first and second printed wiring assemblies each including a plurality of substantially parallel electrical conductors printed on a dielectric substrate element, applying a tacky adhesive flux to the exposed surfaces of said conductors and said diodes, joining the first of said printed circuit assemblies with said diode substrate element by bringing said diodes into contact with the conductors on said first printed circuit assembly whereby the tacky adhesive flux secures them together with said conductors crossing the rows of diodes, subjecting said joined substrates to heat and pressure sufficient to cause said solder to bond said diodes to said printed conductors, dissolving said adhesive and removing the substrate element upon which the diodes were supported, cleaning the remaining flux from the first printed circuit assembly now including the diodes, providing the now exposed surfaces of said diodes with a tacky adhesive flux, joining said second printed circuit assembly with the now exposed surfaces of said diodes by bringing them into contact whereby the tacky adhesive flux secures them together with the conductors on said second printed circuit assembly traversing the columns of diodes at right angles to the conductors on the first printed circuit assembly, subjecting said now joined substrates again to heat and pressure sufficient to cause said solder to bond said diodes with the conductors on said second printed circuit assembly, and finally washing the resultant product to remove excess flux therefrom.

12. The method of fabricating subminiature diode matrix apparatus comprising the steps of, forming an array of diodes in rows and columns on a substrate element by ultrasonic machining of a film of semi-conductors laid on said element, said semi-conductors being affixed to said substrate element by means of soluble adhesive permitting said substrate subsequently to be removed therefrom, opposite surfaces of said diodes being provided with a solderable coating, providing first and second printed wiring assemblies each including a plurality of substantially parallel electrical conductors printed on a dielectric substrate element, applying a tacky adhesive soldering flux to the exposed surfaces of said conductors and said diodes, joining the first of said printed circuit assemblies with said array of diodes by bringing said diodes into contact with the conductors on said first printed circuit assembly whereby the tacky adhesive flux secures them together with said conductors crossing the rows of diodes, subjecting said substrates to heat and pressure sufficient to cause said solder to melt and bond said diodes to said printed conductors, dissolving said adhesive in a heated solvent bath and removing the substrate element upon which the diodes were supported, cleaning the remaining flux from the first printed circuit assembly now including the diodes, providing the now exposed surfaces of said diodes with a tacky adhesive soldering flux, joining said second printed circuit assembly with the now exposed surfaces of said diodes by bringing them into contact whereby the tacky adhesive flux secures them together with the conductors on said second printed circuit assembly traversing the columns of diodes at right angles to the conductors on the first printed circuit assembly, subjecting said now joined substrates again to heat and pressure sufficient to melt and cause the solder to bond said diodes with the conductors on said second printed circuit assembly, and finally washing the resultant product in a cleansing solution to remove excess flux therefrom.

References Cited in the file of this patent

UNITED STATES PATENTS

| | | |
|---|---|---|
| 1,963,834 | Decker | June 19, 1934 |
| 2,714,148 | Howatt | July 26, 1955 |
| 2,850,681 | Horton | Sept. 2, 1958 |
| 2,869,053 | Schaper | Jan. 13, 1959 |
| 2,902,628 | Leno | Sept. 1, 1959 |
| 2,937,410 | Davies et al. | May 24, 1960 |
| 2,989,669 | Lathrop | June 20, 1961 |
| 2,994,121 | Shockley | Aug. 1, 1961 |

FOREIGN PATENTS

| | | |
|---|---|---|
| 1,235,596 | France | May 30, 1960 |

OTHER REFERENCES

I.B.M. Technical Disclosure Bulletin, vol. 1, No. 5, February 1959, Transistor Mounting, F. E. Barrows.